United States Patent [19]
Chapman

[11] Patent Number: 5,468,666
[45] Date of Patent: Nov. 21, 1995

[54] USING A CHANGE IN DOPING OF POLY GATE TO PERMIT PLACING BOTH HIGH VOLTAGE AND LOW VOLTAGE TRANSISTORS ON THE SAME CHIP

[75] Inventor: Richard A. Chapman, Dallas, Tex.

[73] Assignee: Texas Instruments Incorporated, Dallas, Tex.

[21] Appl. No.: 55,999

[22] Filed: Apr. 29, 1993

[51] Int. Cl.⁶ .................................. H01L 21/265
[52] U.S. Cl. .................. 437/44; 437/27; 437/34; 437/56; 437/57; 437/58; 437/152; 257/369; 257/408
[58] Field of Search ................. 437/44, 34, 56, 437/57, 58, 152, 27; 257/369, 408

[56] References Cited

U.S. PATENT DOCUMENTS

| | | | |
|---|---|---|---|
| 4,764,478 | 8/1988 | Hiruta | 437/29 |
| 5,047,358 | 9/1991 | Kosiak et al. | 437/44 |
| 5,087,582 | 2/1992 | Campbell et al. | 437/44 |
| 5,183,773 | 2/1993 | Miyata | 437/44 |
| 5,234,853 | 8/1993 | Ikemasu | 437/44 |

FOREIGN PATENT DOCUMENTS

0414400A2  2/1991  European Pat. Off. .

Primary Examiner—Olik Chaudhuri
Assistant Examiner—Long Pham
Attorney, Agent, or Firm—Jacqueline J. Garner; Richard L. Donaldson; William E. Hiller

[57] ABSTRACT

A semiconductor device having high and low voltage transistors on the same chip. High voltage NMOS transistor 76 comprises a polysilicon gate 40 doped at a first dopant level. Low voltage NMOS transistor comprises a polysilicon gate 44 doped at a second dopant level. The second dopant level is higher than the first. High voltage PMOS transistor 84 comprises a polysilicon gate 48 doped at a third dopant level. Low voltage PMOS transistor comprises a polysilicon gate 52 doped at a fourth dopant level. The fourth dopant level is higher than the third.

11 Claims, 10 Drawing Sheets

1

USING A CHANGE IN DOPING OF POLY GATE TO PERMIT PLACING BOTH HIGH VOLTAGE AND LOW VOLTAGE TRANSISTORS ON THE SAME CHIP

FIELD OF THE INVENTION

This invention generally relates to semiconductor processing and more specifically to using a change in doping of the polysilicon gate to permit placing both high voltage and low voltage transistors on the same chip.

BACKGROUND OF THE INVENTION

As the density of integrated circuits increases, it becomes necessary to shrink the dimensions of NMOS and PMOS transistors. Proper scaling of NMOS and PMOS transistors typically requires that the operating voltage be decreased as the gate oxide thickness is shrunk. Otherwise, the electric field will become too large in the gate oxide and, consequently, the gate oxide will eventually fail.

On the other hand, if the operating voltage is decreased, the device will no longer be compatible with most of the current packaged integrated circuits which operate at a standard voltage. For, instance, most circuits using CMOS transistors with gate lengths of 0.8 microns or more operate at 5.0 V. When the gate length in decreased to 0.5 microns and the gate oxide thickness to 90–120 Å, the voltage is lowered to 3.3 V in order to maintain reliability of the gate oxide. Thus, a device is needed that has input/output peripheral sections that operate at 5.0 V so that the device may be used in systems using other chips operating at 5.0 V while allowing other portions of the device to operate at 3.3 V. The same problem occurs when the gate length is reduced from 0.5 μm to 0.35 μm or 0.25 μm. At 0.35 μm, the voltage is reduced to 2.5 V or lower in order to maintain the integrity of the gate oxide.

One method that has been used to overcome this problem uses longer gate lengths in the input/output CMOS transistors in order to minimize the hot carrier stress problem. However, gate insulator reliability may still be a problem due to the large electric field in the gate insulator.

Another method uses a thicker gate oxide for the input/output sections. This lowers the electric field in the high voltage CMOS transistors. However, this method requires a resist to be patterned on the gate oxide to remove the oxide from one portion of the chip and then strip the resist and grow the second gate oxide of a different thickness. As a result, defects and contamination may occur in the gate oxide.

Another approach uses two polysilicon layers. One polysilicon layer is placed over a first gate of one thickness. Next, a second gate oxide is grown and another polysilicon layer is deposited over the second gate oxide. This process however, adds to many additional process steps.

SUMMARY OF THE INVENTION

Generally, and in one form of the invention, a method for forming a semiconductor device having a semiconductor body is disclosed. A gate oxide is formed over a surface of the semiconductor body and a layer of polysilicon is deposited over the gate oxide. The polysilicon layer is patterned to expose the area where low voltage NMOS transistors are to be formed. The low voltage NMOS region is implanted with an n-type dopant at a first dopant level. The polysilicon layer may then be patterned to expose the area where low voltage PMOS transistors are to be formed. The low voltage PMOS region may then be implanted with a p-type dopant at a second dopant level. The polysilicon layer and gate oxide are then etched to form at least one high voltage NMOS gate, at least one low voltage NMOS gate, and, optionally, at least one low voltage PMOS gate, and at least one high voltage PMOS gate. Note that the low voltage NMOS and PMOS transistor gates will already comprise doped polysilicon. The n+ source/drain regions, the high voltage NMOS gate and the low voltage NMOS gate are implanted with the n-type dopant at a third dopant level. The p+ source/drain regions, the high voltage PMOS gate and the low voltage PMOS gate may then be implanted with the p-type dopant at a fourth dopant level.

An advantage of the invention is in providing a semiconductor device comprising both high and low voltage transistors.

A further advantage of the invention is in providing a semiconductor device having both high and low voltage transistors that avoids gate insulator reliability problems.

A further advantage of the invention is in providing a semiconductor device having both high and low voltage transistors that does not require longer gate lengths in the high voltage transistors.

A further advantage of the invention is in providing a semiconductor device having high voltage transistor gates at one dopant level and low voltage transistor gates at a higher dopant level.

These and other advantages will be apparent to those skilled in the art having reference to this specification, in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The preferred embodiment of the invention will be described in conjunction with CMOS transistors using n+ polysilicon for NMOS gates and p+ polysilicon for PMOS gates. It will be apparent to those skilled in the art that other processes and devices, such as CMOS, BiCMOS, and BiNMOS devices, can also realize the benefits of this invention.

For high voltage performance and packing density, the layout and thickness dimensions of CMOS transistors need to be decreased. This usually results in a decreased operating voltage in order to avoid reliability problems caused by increasing the electric field in the gate insulator. Currently, however, most integrated circuits still need to interact with other circuits using a standard higher voltage. Thus, there is a need for higher voltage input/output sections and lower voltage sections on the same chip. There is also a need to place higher voltage non-volatile memory on the same chip with high density lower voltage CMOS.

The preferred embodiment of the invention provides high and low voltage CMOS on the same chip by means of using lower doping of the polysilicon gates in the high voltage portions of the circuit. In the low doping areas, the electric field from the gate insulator penetrates into the lower portion of the gate and decreases the peak electric field in the gate insulator. In other words, the high voltage CMOS transistors will behave as if they had a thicker gate oxide. Accordingly, the operating voltage can be increased to a higher voltage (e.g., back to 5.0 V) without causing an electric field sufficient to cause gate insulator reliability problems.

Figure 1:
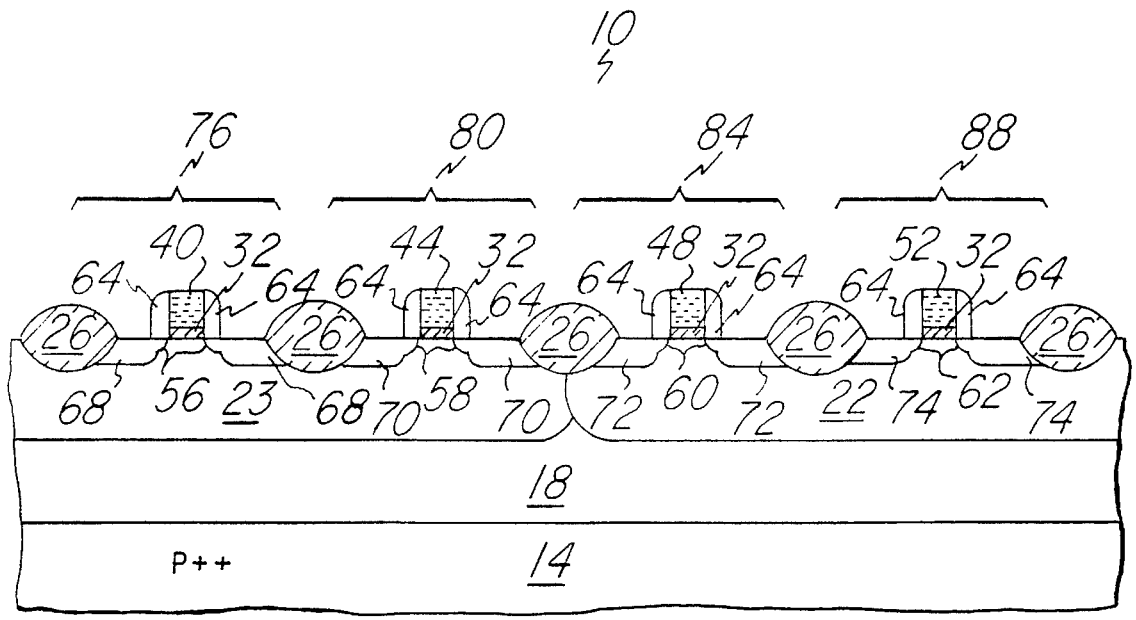
FIG. 1 is a cross-sectional view of the preferred embodiment of the invention.

The preferred embodiment of the invention is shown in FIG. 1. Substrate 14 of device 10 is shown as a p++ substrate. It will be apparent to those skilled in the art that other substrates may alternatively be used. Optional epitaxial layer 18 is p-type into which a patterned p-well 23 may be implanted and which will contain the high voltage NMOS transistor 76 and low voltage NMOS transistor 80. N-well 22 is located in epitaxial layer 18. Field insulating regions 26 may comprise oxide and serve to isolate transistors 76, 80, 84, and 88 from each other. Gate oxide regions 32 and sidewall oxides 64 insulate polysilicon gates 40, 44, 48, and 52.

High voltage NMOS transistor 76 is located in p-well 23 and comprises gate 40 and source/drain regions 68. Transistor 76 may also comprise lightly doped drains (LDDs) 56. Low voltage NMOS transistor 80 is also located in p-well 23 and comprises gate 44, source/drain regions 70, and gate insulator 32. Transistor 80 may also comprise LDDs 58. Low voltage PMOS transistor 84 and high voltage PMOS transistor 88 are located in n-well 22. Low voltage PMOS transistor 84 comprises a gate 48, gate insulator 32 source/drain regions 72, and optionally LDDs 60. High voltage PMOS transistor 88 comprises a gate 52, source/drain regions 74, and optionally LDDs 62.

Figure 2:
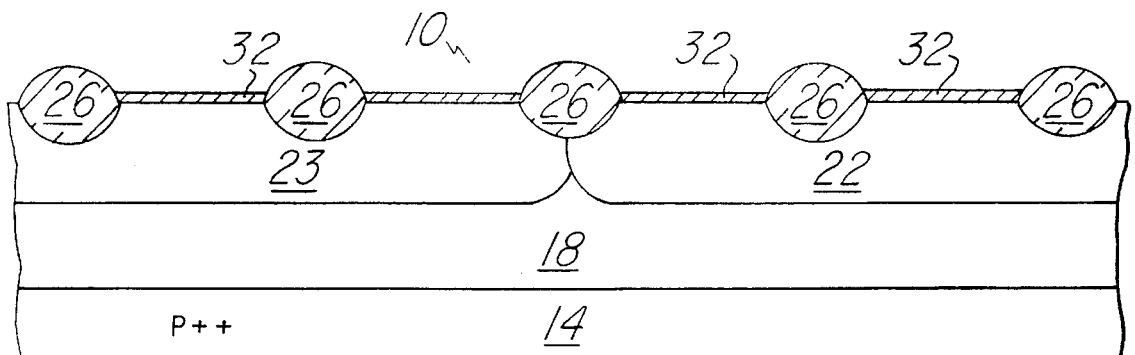
FIG. 2 is a cross-sectional view of semiconductor body used as the starting point for the fabrication of the preferred embodiment of the invention.

FIG. 2 shows semiconductor body 12 after the formation of p-type epitaxial layer 18, n-well 22, p-well 23, field insulating regions 26, and gate oxide 32. The preferred method for forming device 10 in the structure of FIG. 2 will now be described with reference to FIGS. 3a–d.

Figure 3A:
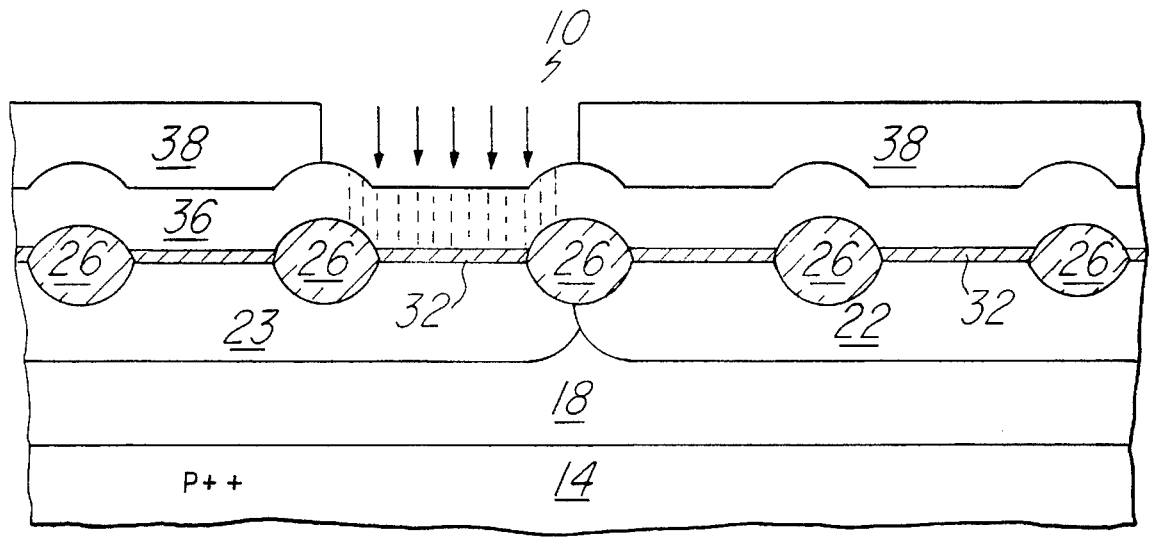
FIGS. 3a–d are cross-sectional views of the preferred embodiment of the invention during various fabrication steps.

Referring to FIG. 3a, a layer of polysilicon 36 is deposited over the gate oxide 32 covering the surface of semiconductor body 12. Polysilicon layer 36 may have a thickness in the range of 0.2 to 0.4 microns, preferably 0.25 microns. For the low voltage transistors, the thickness of polysilicon layer 36 is determined by the depth of the source/drain junctions. Polysilicon layer 36 may be thicker than the source/drain junctions so that when the source/drain junctions are implanted, the dopant does not extend to the bottom of the polysilicon gates. Masking layer 38, for example photoresist, is deposited on the surface of polysilicon layer 36 as shown in FIG. 3a. Masking layer 38 masks portions of polysilicon layer 36 where high voltage NMOS transistor 76 and both high and low voltage PMOS transistors 84 and 88 are to be formed. The exposed portion of polysilicon layer 36 is implanted with phosphorus (e.g., 5E15 P/cm$^2$) and annealed. Typically, the implant will be a high energy implant in the range of 1E15 to 1E16 P or As/cm$^2$.

Figure 3B:
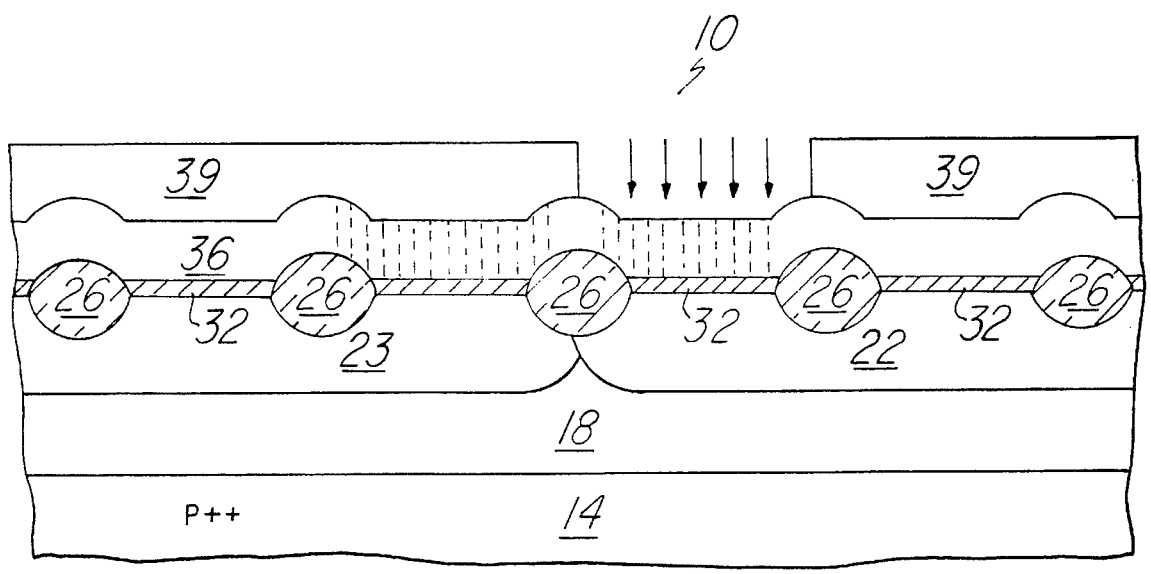

Masking layer 38 is then removed and a second masking layer 39 is deposited, as shown in FIG. 3b. Masking layer 39 masks portions of polysilicon layer 36 where both high and low voltage NMOS transistors 76 and 80 and high voltage PMOS transistor 88 are to be formed. The exposed portion of polysilicon layer 36 is then implanted with boron (e.g., 7E15 B/cm$^2$) and annealed. Typically, the implant will be a high energy implant in the range of 1E15 B/cm$^2$ to 1E16 B/cm$^2$. An anneal is used to anneal implant damage before gate etch and to drive both the n-type and p-type dopant material to the bottom of polysilicon layer 36. Masking layer 39 is then removed.

Figure 3C:
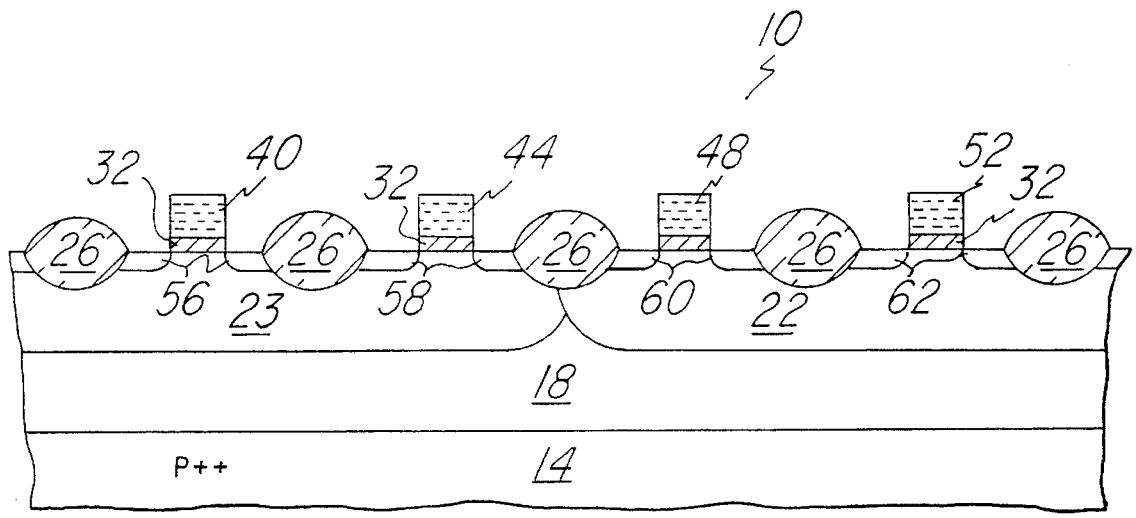

Referring to FIG. 3c, polysilicon layer 36 is then patterned by microlithography and etched, along with gate oxide 32 to form gates 40, 44, 48, and 52. At this point, LDDs 56, 58, 60, and 62 may optionally be formed. N+ LDDs 56 and 58 are patterned and implanted in p-type epitaxial layer 18 by conventional techniques. Then, p+ LDDs 60 and 62 are patterned and implanted into n-well 22 by conventional techniques.

Figure 3D:
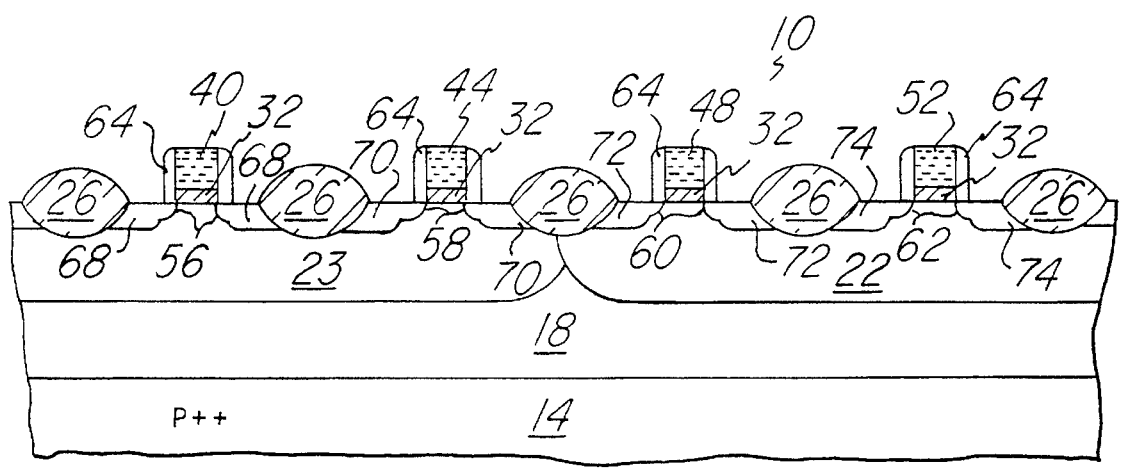

As shown in FIG. 3d, sidewall oxides 64 are now formed on the vertical edges of gates 40, 44, 48, and 52 as is well known in the art (e.g., CVD deposition of silicon dioxide and followed by an anisotropic etch). Following the formation of sidewall oxides 64, n+ source/drain regions 68 and 70 are patterned and implanted (e.g., 2E15 As/cm$^2$ at 80 keV plus 4E14 P/cm$^2$ at 60 keV), as shown in FIG. 3d. Other dopant concentrations will be apparent to those skilled in the art. However, typically the doping implant dose will be in the range 1E15/cm$^2$ to 5E15/cm$^2$. It will also be apparent to those skilled in the art that an implant of either arsenic or phosphorous or a combination thereof may be used. Finally, p+ source/drain regions 72 and 74 are patterned and implanted (e.g., 1.5E15 B/cm$^2$). Typically, the doping implant dose will be in the range of 1E15/cm$^2$ to 5E15/cm$^2$ and the dopant species may, for example, be boron or BF$_2$.

Figure 4A:
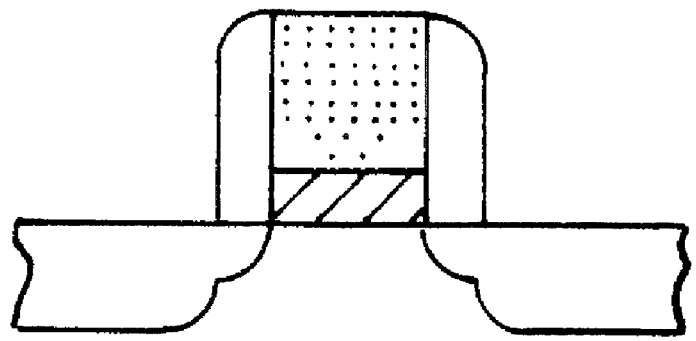
FIGS. 4a–b are cross-sectional views of lightly and heavily doped poly gates, respectively.
Figure 4B:
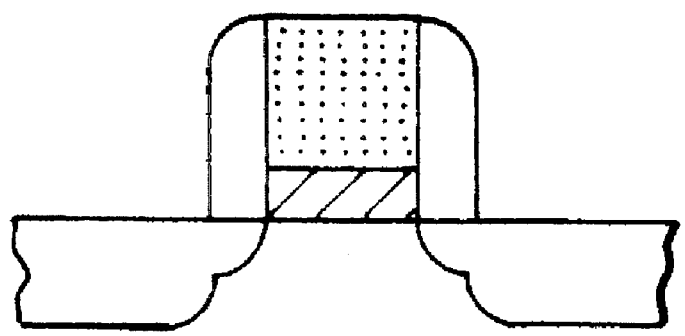
Figure 5A:
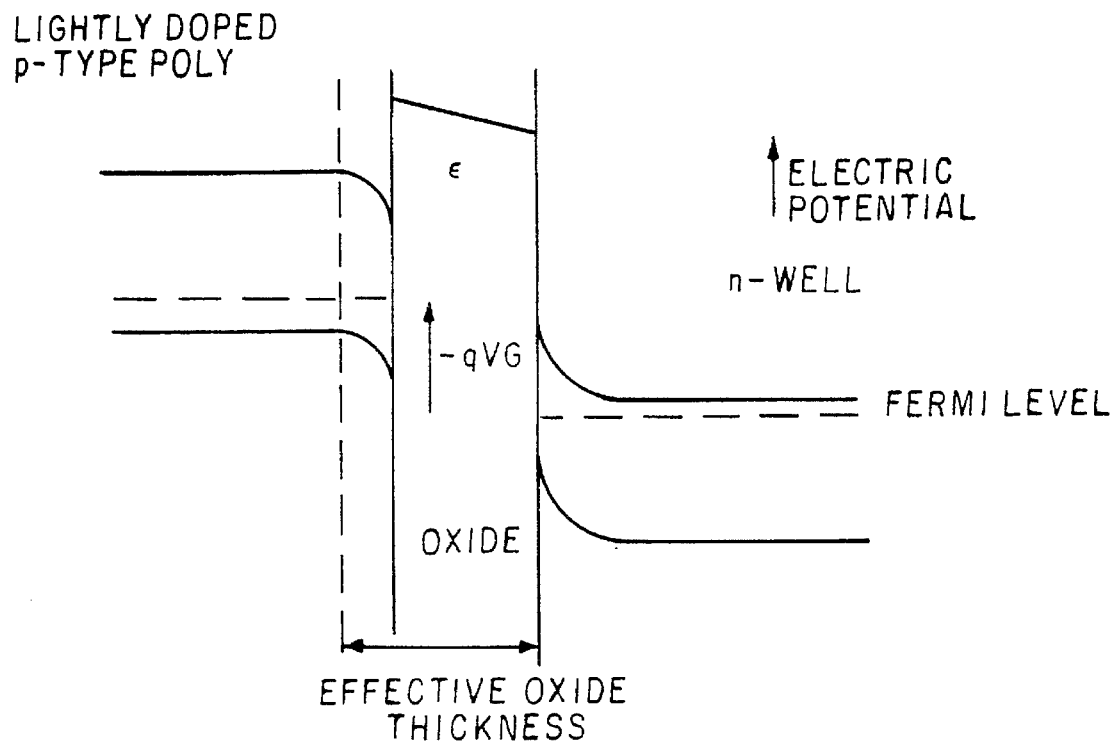
FIGS. 5a–b are band diagrams over the active channel of PMOS transistors having lightly and heavily doped poly gates, respectively.
Figure 5B:
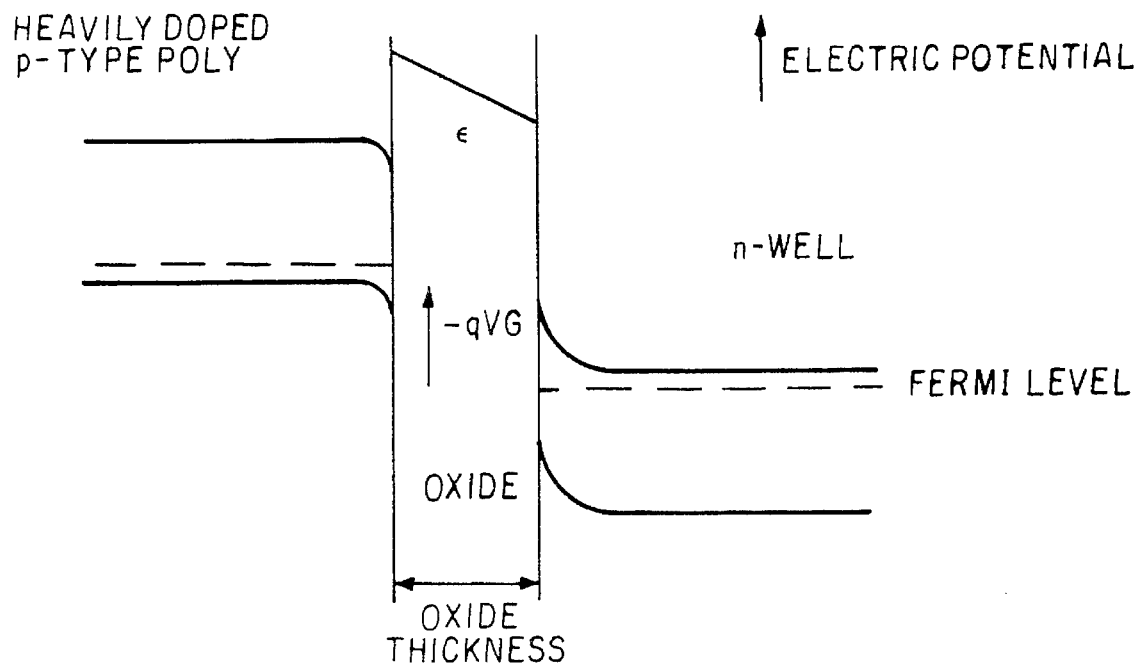

Because polysilicon layer 36, and thus gates 40, 44, 48, and 52, are at least as thick as source/drain regions 56, 58, 60, and 62, the implants forming the source/drain regions 56–62, will only partially dope the polysilicon gates 40 and 52, as shown in FIG. 4a with only a small amount of dopant reaching the bottom surface of the polisilicon. The high energy implant and anneal performed prior to the gate etch combined with the source/drain implants, completely dope polysilicon gates 44 and 48, as shown in FIG. 4b. The light doping at the bottom of high voltage, NMOS and PMOS gates 40 and 52, enables the electric field to penetrate into the bottom of the polysilicon gate. FIG. 5a shows an electric potential band diagram for a high voltage PMOS transistor, such as transistor 88, having a lightly doped gate according to the invention. The electric field extends from the oxide into the polysilicon gate making the effective oxide thickness greater than the actual oxide thickness. FIG. 5b shows a band diagram for a low voltage PMOS transistor, such as transistor 84, having a highly doped gate. The electric field will not penetrate into the low voltage areas because of the heavy doping at the bottom of the low voltage gates. The electric field remains within the oxide region.

FIGS. 5a and 5b are for the case of PMOS transistors with p-type poly. The case for NMOS transistors with n-type poly would have similar band diagrams but with the opposite polarity.

An experiment was performed using three different gate oxide thicknesses: 45 Å, 55 Å, and 65 Å. Table I shows the Capacitance-Voltage test results for the experiment. The nomenclature PG12 indicates that these wafers had extra patterned implants of 7E15-P/cm$^2$ over NMOS and 7E15-B/cm$^2$ over PMOS. These implants are in addition to the source/drain implants that are patterned after gate etch (and go into both the poly gate and the source/drains). The NMOS source/drain implant is 2E15-As/cm$^2$ @ 80 keV plus 4E14-P/cm$^2$ @ 60 keV. The PMOS source/drain implant is 1.5E15-B/cm$^2$ @ 20 keV. The polysilicon thickness is 2500 Å in all cases. The column tOX ACC indicates the effective oxide thickness derived from the maximum capacitance at |3.5 V| in accumulation. The column tOX INV gives the effective oxide thickness derived from the maximum inversion capacitance measured by Quasi-Static techniques at |3.5 V| in inversion. Note for wafer 09 without the extra implant, that the effective NMOS capacitance in inversion is 73A in comparison to 59.7 A in accumulation. Even larger differences can be obtained between cases "S/D" and S/D+PG12" by increasing the poly thickness or decreasing the S/D dose.

that the poly surface in this region is partially accumulated or partially depleted with the capacitance slowly rising: thus, the capacitance is low because the Debye length or depletion depth in the poly is comparable with the gate oxide thickness—minority carriers in the poly are not involved.

Figure 7A:
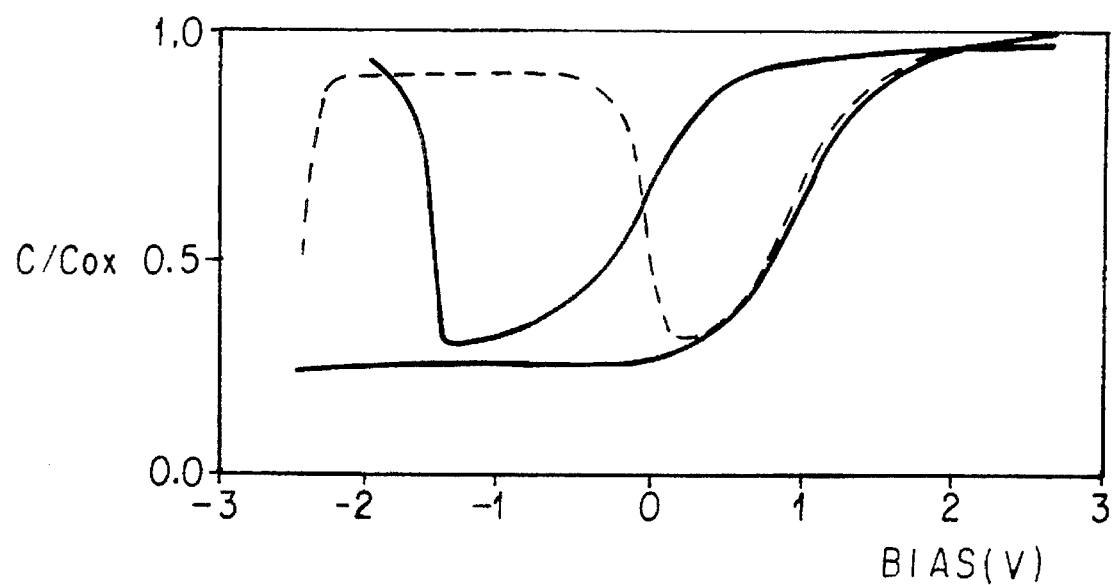
FIGS. 7a–b are C-V diagrams of NMOS and PMOS transistors, respectively, having poly gates doped once during the source/drain implant.
Figure 7B:
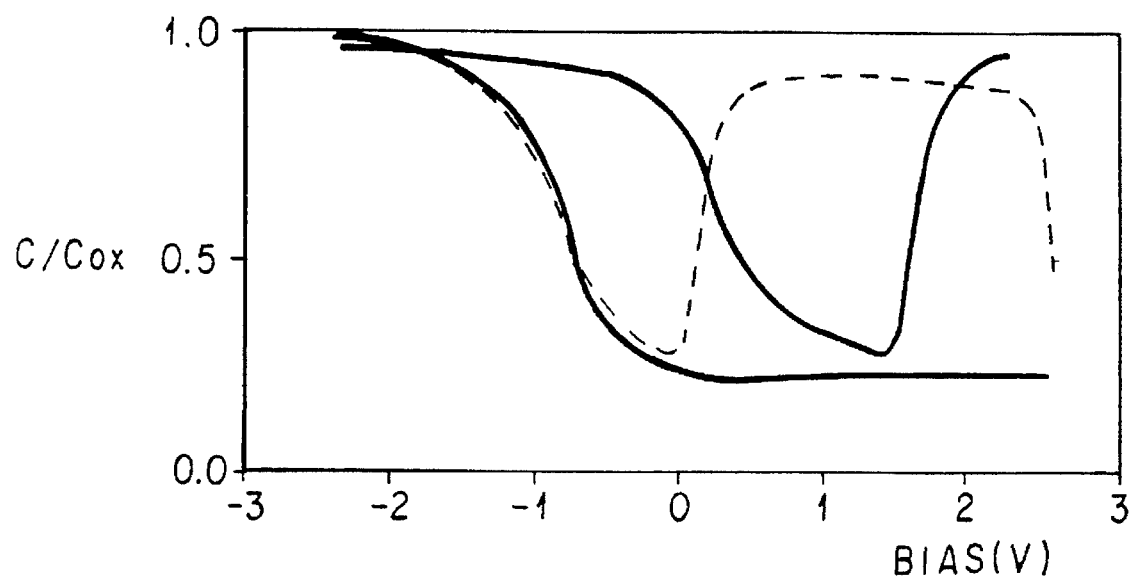
Figure 8A:
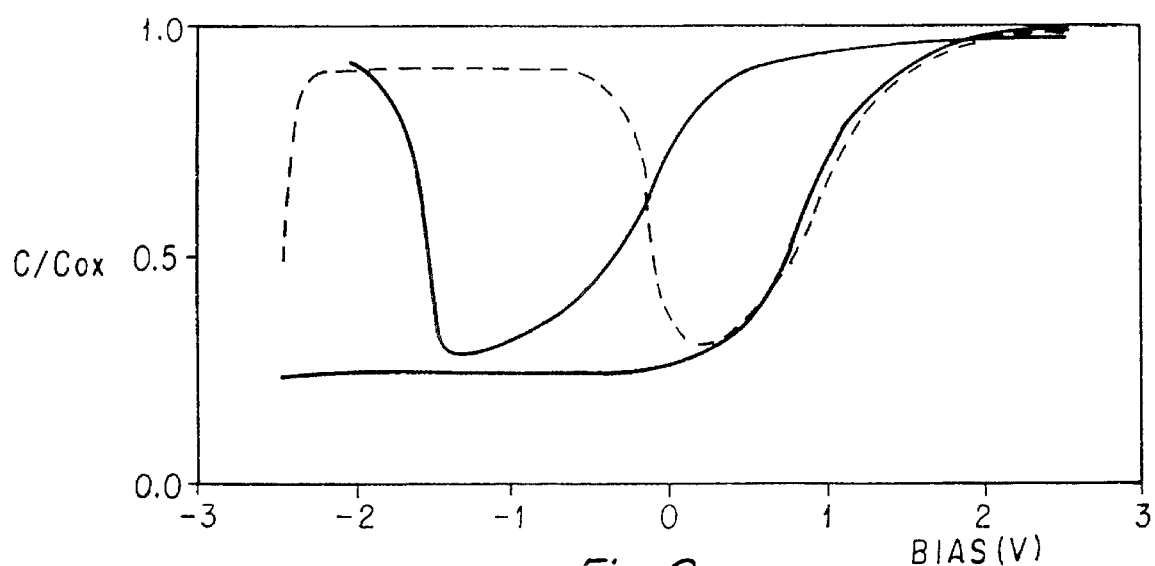
FIGS. 8a–b are C-V diagrams of NMOS and PMOS transistors, respectively, having extra poly gate doping.
Figure 8B:
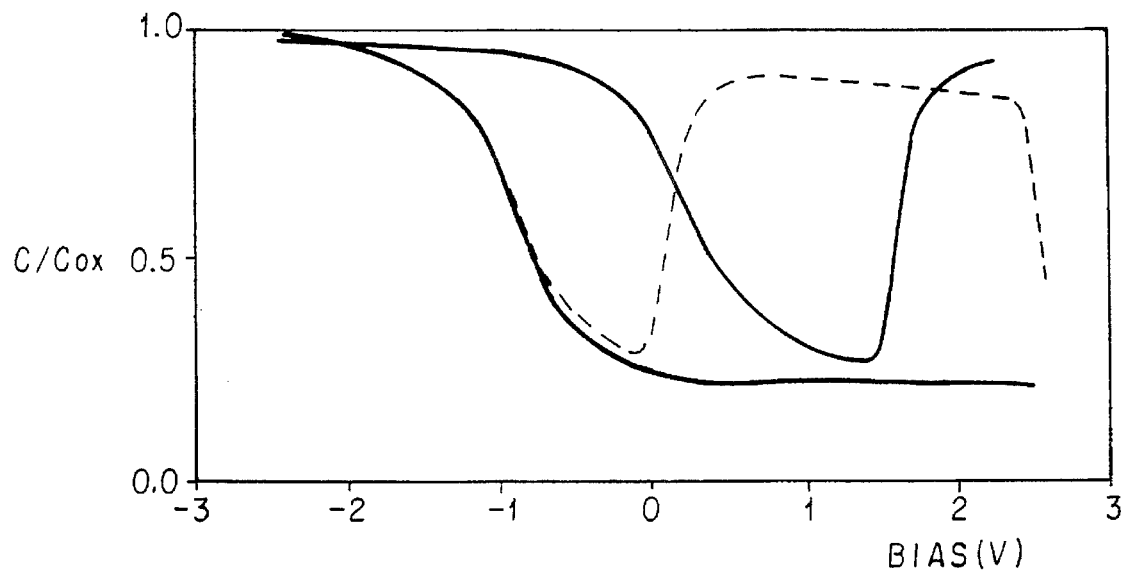

FIGS. 7a, 7b, 8a, and 8b show the Capacitance-Voltage characteristics corresponding to wafers 14 and 15 in Table I. Each figure shows the measured high frequency C-V, the theoretical high frequency C-V, and the measured Quasi-Static C-V. FIG. 7a shows the PMOS C-V with source/drain implant alone. FIG. 7b shows the NMOS C-V with source/drain implant alone. FIG. 8a shows the PMOS C-V with extra dopant and FIG. 8b shows the NMOS C-V with extra dopant. Note the difference is capacitance in channel inversion with and without the added 7E15/cm$^2$ implant for NMOS and PMOS. For example, the difference between tOX INV for the source/drain implant alone, as shown in FIG. 7a and tOX INV for wafer 16 with the added implant, as shown in FIG. 8b is on the order of 10 Å.

Figure 9:
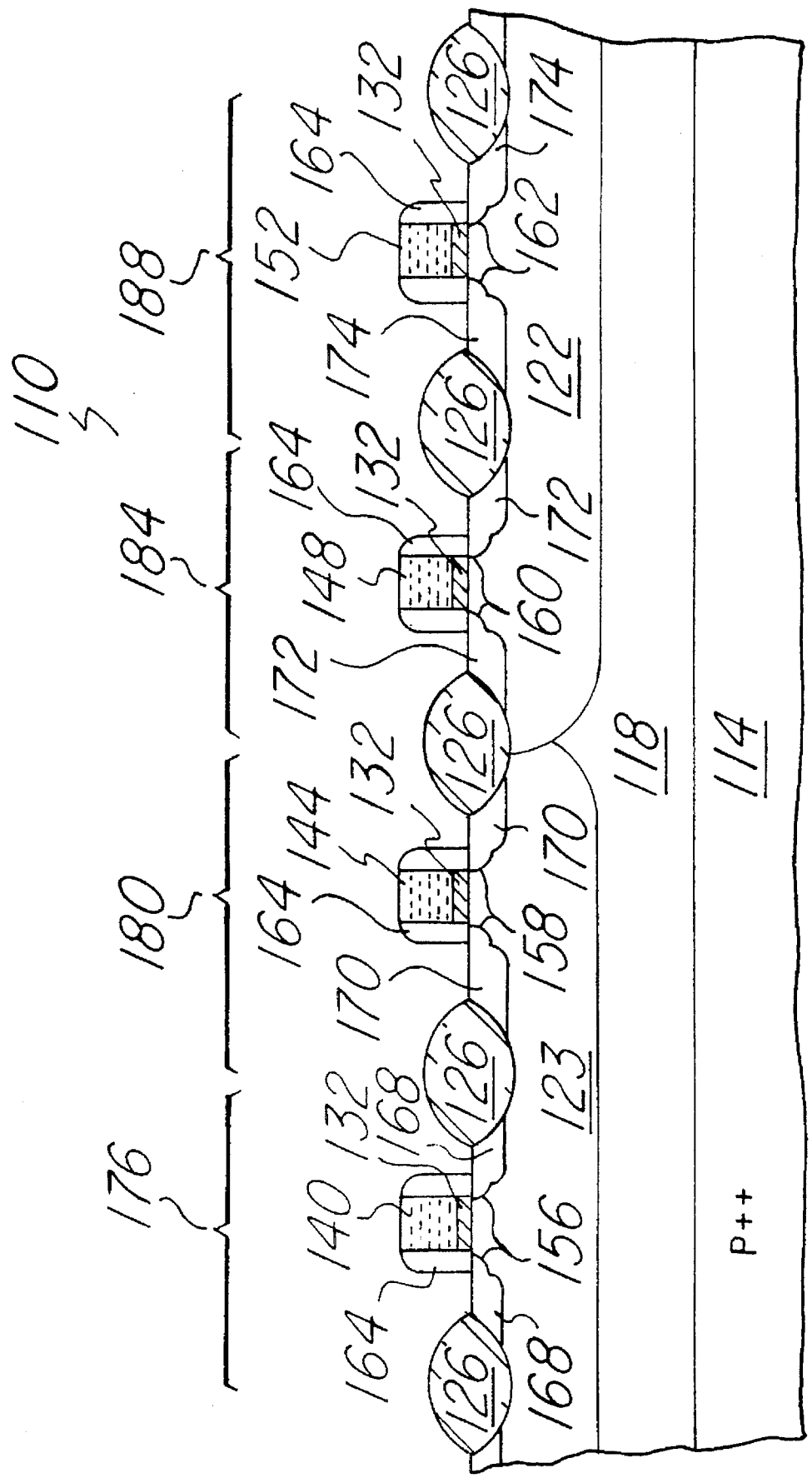
FIG. 9 is cross-sectional view of an alternate preferred embodiment of the invention.

An alternate preferred embodiment of the invention is shown in FIG. 9. Device 110 is identical to device 10 except that all transistors are high voltage. Thus, the fabrication of device 110 is identical to that described above for device 10 except that the implants and anneals done prior to the

TABLE 1

| | ANALYSIS OF C-V DATA FOR LOT-9628 | | | | | | | |
|---|---|---|---|---|---|---|---|---|
| | NMOS | | | | PMOS | | | |
| Wafer/implant | tOX ACC | VFB volts | tOX INV | SUBST CONC. | tOX ACC | VFB volts | tOX INV | SUB CONC. |
| 03 S/D | 40.8A | −1.03V | 53A | 3.5E17 | 42.5A | +1.04V | 51A | 4.9E17/cm3 |
| 04 S/D + PG12 | 41.1 | −1.00 | 43 | 3.6E17 | 42.9 | +1.13 | 47.8 | 4.2E17 |
| 09 S/D | 59.7 | −1.07 | 73 | 3.5E17 | 60.4 | +1.05 | 69.6 | 4.9E17 |
| 10 S/D + PG12 | 60.0 | -1.03 | 63 | 3.6E17 | 60.7 | +1.15 | 66.6 | 4.5E17 |
| 14 S/D | 52.3 | −1.06 | 61.7 | 3.6E17 | 53.3 | +1.03 | 60.0 | 4.6E17 |
| 16 S/D + PG12 | 51.7 | −1.00 | 52.7 | 3.6E17 | 52.6 | +1.12 | 60.6 | 4.2E17 |

Figure 6A:
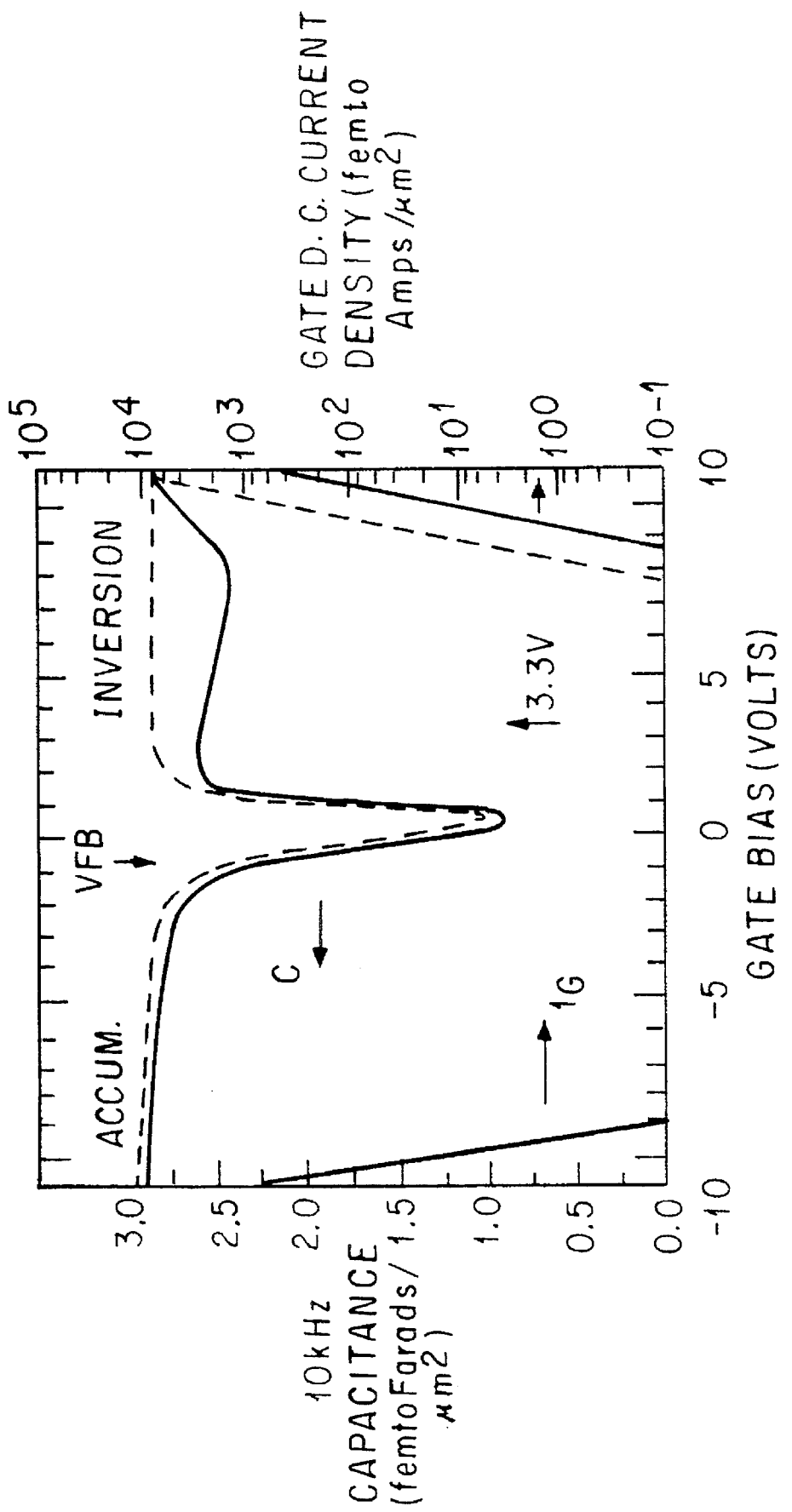
FIGS. 6a–b are C-V diagrams of NMOS and PMOS transistors, respectively, having a gate oxide of 120 Å.
Figure 6B:
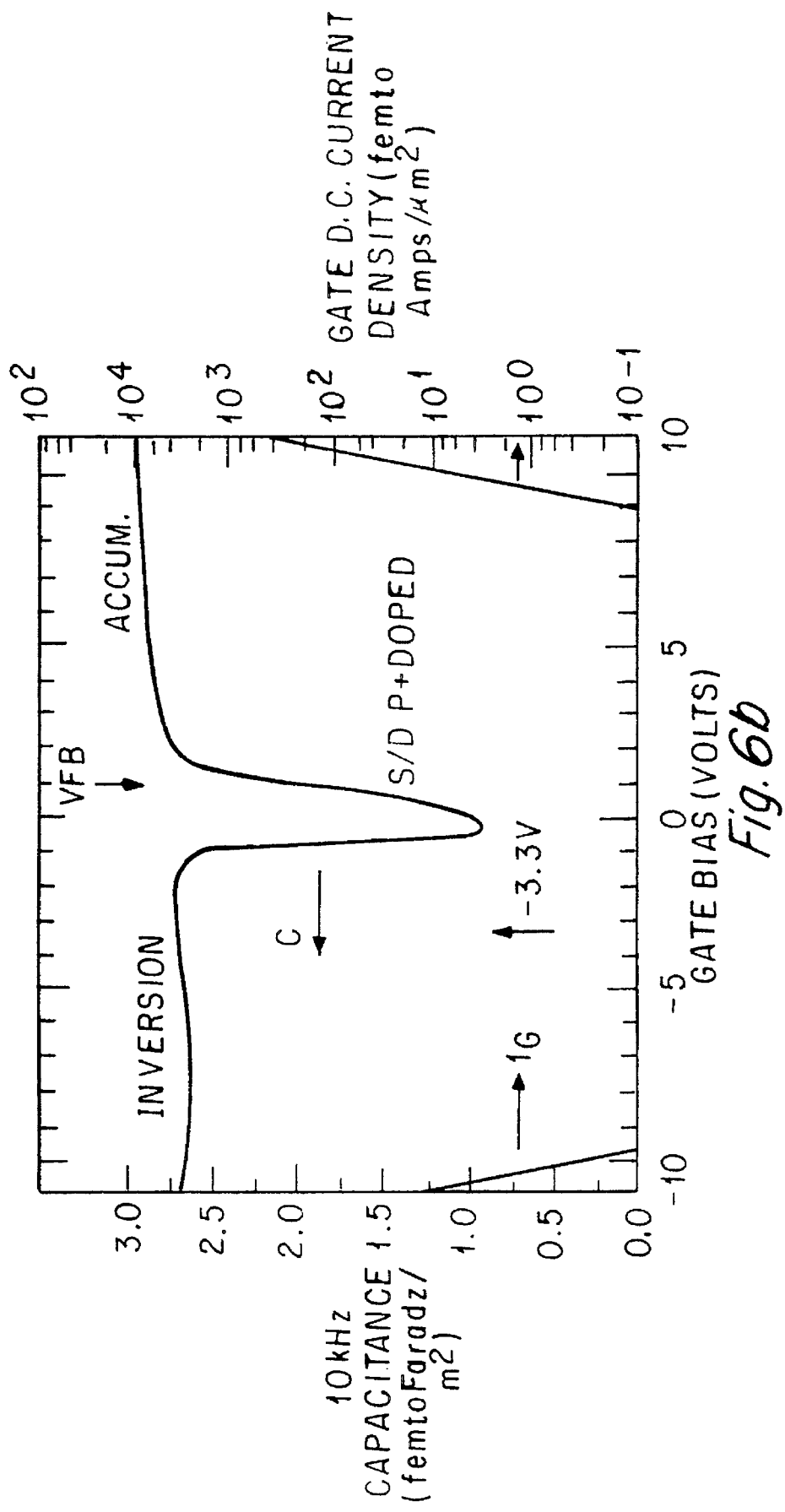

FIGS. 6a and 6b show the capacitance-voltage and gate current characteristics for 120 Å gate oxide. The effect can be most clearly seen in FIG. 6a for NMOS. For this NMOS structure, both the poly gate and the transistor channel are p-type. Therefore, a negative gate bias causes both the gate and the channel to be accumulated. The capacitance decreases in accumulation as the gate voltage is decreased towards zero because the majority carrier concentration is decreasing as the channel surface potential moves towards depletion: the change in capacitance is due to a change in the Debye length with surface majority carrier concentration. Near VG=+8 V, a secondary minimum in capacitance occurs when the bottom of the poly is fully depleted. At VG=+10 V, both the poly surface and the channel surface are inverted. In the region between +1 V and +8 V, the channel is inverted and the poly is partially depleted. The slow rise in capacitance as the gate voltage VG is decreased from +8 V to +1 V is due to the change in depletion depth of the poly bottom surface and this change is slow because the poly is much more heavily doped than the channel. The preferred embodiments of the invention take advantage of the fact of lower capacitance in the VG=+1 V to VG=+8 V region. Although the NMOS gate oxide thickness is often measured electrically in accumulation at −5 V, an NMOS transistor normally operates only between the range VG=OV and VG=5 V (for a 5 V supply). Thus, in actual operation, the transconductance and gate capacitance are set by the capacitance with the channel in depletion of inversion. It is important to note polysilicon etch are omitted. Device 110 has a substrate 114, which may for example be p++, and an optional epitaxial layer 118, which may be p-type. N-well 122 is located in epitaxial layer 118. Field insulating regions 126 may comprise oxide and serve to isolate transistors 176, 180, 184, and 188 from each other. Gate oxide regions 132 and sidewall oxides 164 insulate polysilicon gates 140, 144, 148, and 152. NMOS transistors 176 and 180 both operate at a higher voltage and are located p-well 123. NMOS transistor 176 comprises gate 140 and source/drain regions 168. Transistor 176 may also comprise lightly doped drains (LDDs) 156. NMOS transistor 180 comprises gate 144 and source/drain regions 170. Transistor 180 may also comprise LDDs 158. PMOS transistors 184 and 188 are located in n-well 122. PMOS transistor 184 comprises a gate 148, source/drain regions 172, and optionally LDDs 160. High voltage PMOS transistor 188 comprises a gate 152, source/drain regions 174, and optionally LDDs 162.

An important aspect of the preferred embodiments is that the poly thickness may be chosen thicker than in the usual design. Generally for CMOS using patterned n+/p+ poly gates, the poly gate thickness is adjusted relative to the depth of the source/drain junctions such that the source/drain implants also sufficiently dope the bottom of the poly gate but the poly thickness should not be so thin that the source/drain implants penetrate the gate oxide and compensate the channel. In this invention, the poly gate thickness may be chosen relatively thick so that those transistors for high voltage operation that are doped by the source/drain implants alone will not be heavily doped on the bottom surface of the poly gate: in this way, the electric field will penetrate into the poly. Since the patterned implants to dope the poly for the low voltage transistors are implanted before gate etch, higher implant energies and doses can be used to adequately dope the bottom of the poly without regard to the requirements for the source/drain doping profiles.

It should be noted that if BiNMOS input/output drivers are used, then only the added implant for the NMOS transistors would be performed. If the input/output circuits are NMOS only, then obviously only the added pattern for NMOS would be performed.

It should also be noted that the low voltage transistors can be built with an unpatterned n+ implant thus producing low-voltage buried channel PMOS transistors using $n^+$ poly rather than $p^+$ poly and high voltage surface channel transistors.

The foregoing description of the electric field penetration into the bottom of the polysilicon gate has been explained by reference to FIGS. 5, 6, 7, and 8 (a and b) which describe the situation over the active channel of the transistor. It should be noted that the electric field will also penetrate into the lightly doped polysilicon over the edges of the gate where the gate passes over the LDD or source drain. In fact, the penetration of the electric field into the lightly doped polysilicon is even greater than over the active channel because the electric field current cannot penetrate into the silicon underneath the gate oxide because the LDD or S/D is more heavily doped.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a semiconductor device having a semiconductor body, comprising the steps of:
    a. forming a gate oxide over a surface of said semiconductor body;
    b. depositing a layer of polysilicon over said gate oxide;
    c. masking said polysilicon layer overlying a high voltage NMOS region and exposing a first portion of said polysilicon layer overlying a low voltage NMOS region;
    d. implanting said first portion of said polysilicon layer with an n-type dopant at a first dopant implant dose;
    e. etching said polysilicon layer and said gate oxide to form at least one high voltage NMOS gate in said high voltage NMOS region and at least one low voltage NMOS gate in said low voltage NMOS region; and
    f. implanting first and second source/drain regions on opposite sides of said high voltage NMOS gate, third and fourth source/drain regions on opposite sides of said low voltage NMOS gate, said high voltage NMOS gate and said low voltage NMOS gate with said n-type dopant at a second dopant implant dose.

2. The method of claim 1 further comprising the steps of:
    a. masking said polysilicon layer overlying a high voltage PMOS region, said high voltage NMOS region and said low voltage NMOS region and exposing said polysilicon layer overlying a low voltage PMOS region after implanting said first portion of said polysilicon layer with an n-type dopant;
    b. implanting said polysilicon layer overlying said low voltage PMOS region with a p-type dopant at a third dopant implant dose prior to etching said polysilicon layer, wherein said etching said polysilicon layer step also forms at least one low voltage PMOS gate in said low voltage PMOS region and at least one high voltage PMOS gate in a high voltage PMOS region; and
    c. implanting fifth and sixth source/drain regions on opposite sides of said high voltage PMOS gate, seventh and eighth source/drain regions on opposite sides of said low voltage PMOS gate, said high voltage PMOS gate and said low voltage PMOS gate with said p-type dopant at a fourth dopant implant dose.

3. The method of claim 2, wherein said semiconductor body comprises:
    a. an epitaxial layer of a first conductivity type on a substrate of said first conductivity type;
    b. a well region of a second conductivity type on said epitaxial layer; and
    c. a plurality of field insulating areas on said epitaxial layer and said well region separating said high voltage NMOS gate, said low voltage NMOS gate, said low voltage PMOS gate and said high voltage PMOS gate from each other.

4. The method of claim 3, wherein said first conductivity type is p-type, said second conductivity type is n-type and said fifth, sixth, seventh and eighth source/drain regions are formed in said well region.

5. The method of claim 2, further comprising the steps of:
    a. annealing said semiconductor body after said step of implanting said first portion of said polysilicon layer; and
    b. annealing said semiconductor body after said step of implanting said polysilicon layer overlong said low voltage PMOS region.

6. The method of claim 2, further comprising the step of implanting lightly doped drains on opposite sides of each of said high voltage NMOS gates, low voltage NMOS gates, low voltage PMOS gates, and said high voltage PMOS gates after said step of etching said polysilicon layer and said gate oxide.

7. The method of claim 2, wherein said polysilicon layer has a thickness greater than a depth of said first, second, third, fourth, fifth, sixth, seventh and eighth source/drain regions.

8. The method of claim 2, wherein said polysilicon layer has a thickness in the range of 0.2–0.4 microns.

9. The method of claim 2, wherein said first and third dopant implant doses are in the range of $1E15/cm^2$ to $1E16/cm^2$ and said second and fourth dopant implant doses are in the range of $1E15/cm^2$ to $5E15/cm^2$.

10. The method of claim 2, wherein said n-type dopant is phosphorus and said p-type dopant is boron.

11. The method of claim 2, wherein said n-type dopant is arsenic and said p-type dopant is boron.

* * * * *